(12) United States Patent
Aouini et al.

(10) Patent No.: US 9,787,466 B2
(45) Date of Patent: Oct. 10, 2017

(54) HIGH ORDER HYBRID PHASE LOCKED LOOP WITH DIGITAL SCHEME FOR JITTER SUPPRESSION

(71) Applicants: Sadok Aouini, Quebec (CA); Naim Ben-Hamida, Ottawa (CA); Mahdi Parvizi, Ottawa (CA)

(72) Inventors: Sadok Aouini, Quebec (CA); Naim Ben-Hamida, Ottawa (CA); Mahdi Parvizi, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 15/064,975

(22) Filed: Mar. 9, 2016

(65) Prior Publication Data

US 2017/0264425 A1    Sep. 14, 2017

(51) Int. Cl.
| | | |
|---|---|---|
| *H03D 3/24* | (2006.01) |
| *H04L 7/033* | (2006.01) |
| *H03L 7/099* | (2006.01) |
| *H03L 7/085* | (2006.01) |
| *H03L 7/08* | (2006.01) |
| *H03L 7/23* | (2006.01) |
| *H03L 7/07* | (2006.01) |
| *H03L 7/06* | (2006.01) |
| *H03L 7/193* | (2006.01) |
| *H03L 7/18* | (2006.01) |

(Continued)

(52) U.S. Cl.
CPC .......... *H04L 7/0331* (2013.01); *H03L 7/0802* (2013.01); *H03L 7/06* (2013.01); *H03L 7/07* (2013.01); *H03L 7/085* (2013.01); *H03L 7/0805* (2013.01); *H03L 7/093* (2013.01); *H03L 7/099* (2013.01); *H03L 7/0992* (2013.01); *H03L 7/18* (2013.01); *H03L 7/1806* (2013.01); *H03L 7/193* (2013.01); *H03L 7/1974* (2013.01); *H03L 7/1976* (2013.01); *H03L 7/23* (2013.01); *H03L 7/235* (2013.01); *H03L 2207/06* (2013.01); *H03L 2207/50* (2013.01)

(58) Field of Classification Search
CPC ....... H03L 7/0802; H03L 7/085; H03L 7/093; H03L 7/1976; H03L 2207/50; H03L 7/099; H03L 7/0992; H03L 7/18; H03L 7/23; H03L 2207/06; H03L 7/06; H03L 7/07; H03L 7/0805; H03L 7/1806; H03L 7/193; H03L 7/1974; H03L 7/235
See application file for complete search history.

(56) References Cited

U.S. PATENT DOCUMENTS

| 6,380,703 B1 | 4/2002 | White |
| 6,931,089 B2 | 8/2005 | Wu et al. |

(Continued)

OTHER PUBLICATIONS

Extended European Search Report in corresponding European Patent Application No. 17160147.9 dated Aug. 4, 2017 (7 pages).

*Primary Examiner* — Janice Tieu
(74) *Attorney, Agent, or Firm* — Osha Liang LLP

(57) ABSTRACT

A method for filtering noise. The method may include obtaining an output signal from a phase locked loop (PLL) device. The method may include determining, using a digital phase detector and the output signal, an amount of PLL error produced by the PLL device. The method may include filtering, using a delay element and a digital filter, a portion of the amount of PLL error from the output signal to produce a filtered signal in response to determining the amount of PLL error produced by the PLL device.

20 Claims, 5 Drawing Sheets

(51) Int. Cl.
*H03L 7/197* (2006.01)
*H03L 7/093* (2006.01)

(56) References Cited

U.S. PATENT DOCUMENTS

| | | | |
|---|---|---|---|
| 7,233,183 B1 | 6/2007 | Sancheti | |
| 8,384,452 B1* | 2/2013 | Parker | H03L 7/07 327/147 |
| 8,384,456 B1 | 2/2013 | Ramaswamy | |
| 2004/0036538 A1* | 2/2004 | Devries | H03L 7/24 331/16 |

* cited by examiner

HIGH ORDER HYBRID PHASE LOCKED LOOP WITH DIGITAL SCHEME FOR JITTER SUPPRESSION

BACKGROUND

A phase locked loop may produce a synchronized clock signal that has a phase and/or frequency matched with a reference clock source. For example, the synchronized clock signal may be matched to phase and/or frequency information obtained through synchronous Ethernet (SyncE), or from a precision time protocol (PTP), such as a protocol based on the IEEE 1588 standard. Thus, the synchronized clock signal may be used to control various operations performed on a computing system.

SUMMARY

In general, in one aspect, embodiments relate to a system that includes a phase locked loop (PLL) device. The PLL device includes an analog phase detector that obtains a reference signal. The PLL device further includes a voltage-controlled oscillator (VCO) device. The VCO device generates, based on the reference signal, an output signal. The system further includes a delay element coupled to the VCO device and the analog phase detector. The system further includes a digital phase detector coupled to the delay element and the VCO device. The digital phase detector determines an amount of PLL error based on the reference signal and the output signal. The system further includes a digital filter coupled to the digital phase detector. The delay element and the digital filter, using the amount of PLL error, filter a portion of the amount of PLL error from the output signal to generate a filtered signal. The analog phase detector detects, based on the filtered signal, an amount of phase error in the reference signal.

In general, in one aspect, embodiments relate to an apparatus that includes a phased locked loop (PLL) device. The apparatus further includes a processing system coupled to the PLL device. The processing system obtains an output signal from the PLL device. The processing system further determines, using a digital phase detector and the output signal, an amount of PLL error produced by the PLL device. The processing system further filters, using a delay element and a digital filter, a portion of the amount of PLL error from the output signal in response to determining the amount of PLL error produced by the PLL device.

In general, in one aspect, embodiments relate to a method for filtering noise. The method includes obtaining an output signal from a phase locked loop (PLL) device. The method further includes determining, using a digital phase detector and the output signal, an amount of PLL error produced by the PLL device. The method further includes filtering, using a delay element and a digital filter, a portion of the amount of PLL error from the output signal to produce a filtered signal in response to determining the amount of PLL error produced by the PLL device.

Other aspects of the invention will be apparent from the following description and the appended claims.

DETAILED DESCRIPTION

Figure 1:
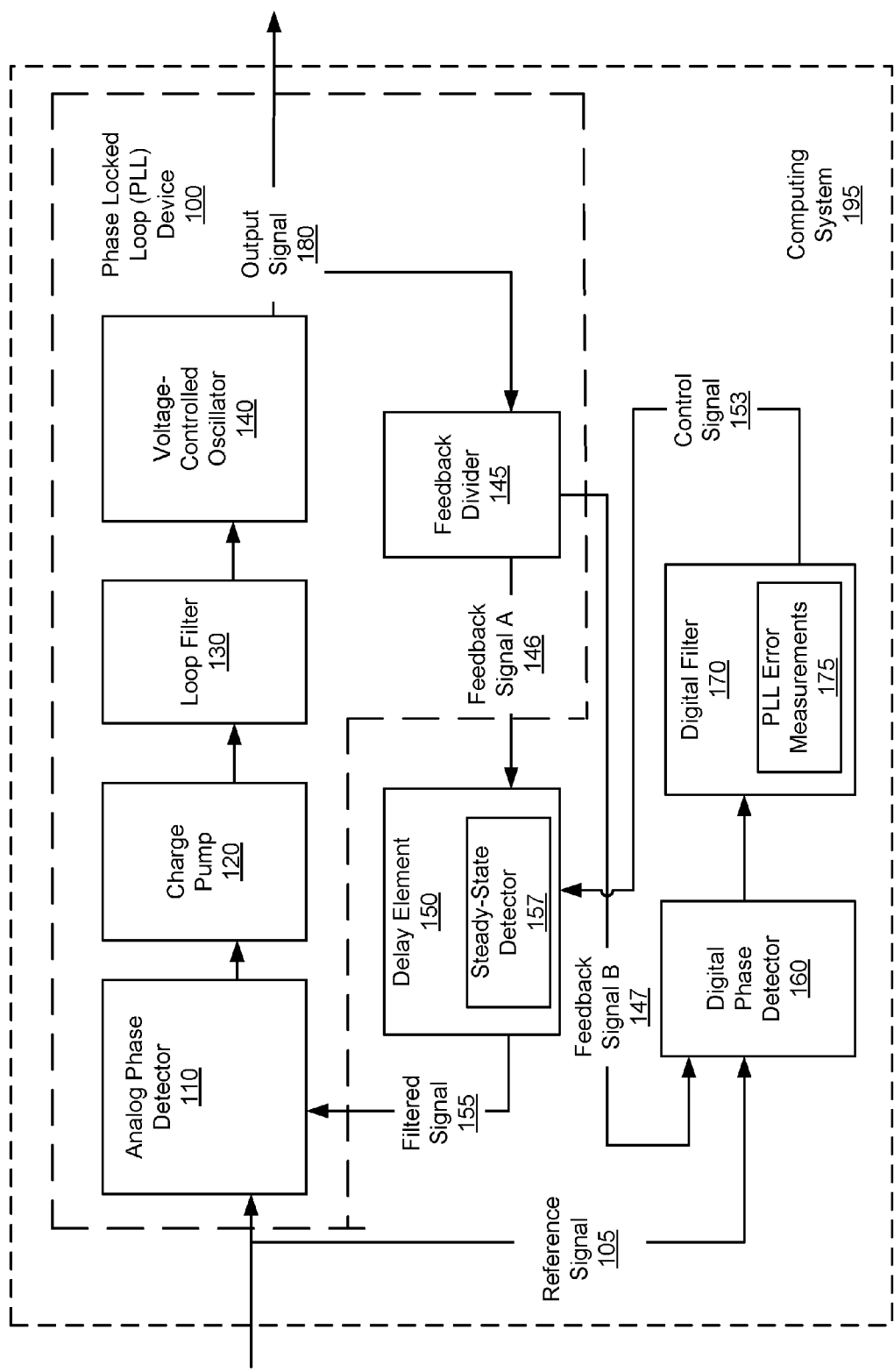
FIG. 1 shows a system in accordance with one or more embodiments.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention include a system, an apparatus, and a method for filtering noise. In particular, one or more embodiments are directed to a system that includes a phase locked loop (PLL) device and a delay element. A digital phase detector coupled to the PLL device may determine an amount of PLL error in an output signal produced by the PLL device. In particular, PLL error may refer to jitter, which is a type of noise produced within the output signal. For example, jitter in the output signal may be generated by one or more components inside the PLL device. As such, based on the amount of PLL error, the delay element may filter the output signal to produce a filtered signal for use by an analog phase detector inside the PLL device. Accordingly, the analog phase detector may use the filtered signal for locking the output signal to a reference signal. Thus, the locked output signal from the PLL device produced using the delay element may have reduced jitter and/or other PLL error.

FIG. 1 shows a block diagram of a system in accordance with one or more embodiments. In one or more embodiments, as shown in FIG. 1, a computing system (195) includes a phase locked loop (PLL) device (100). For example, the computing system (195) may be a computing system as described in FIG. 5 below. The PLL device (100) may be hardware and/or software that implements a control system with functionality to synchronize an output signal to an input signal. Specifically, the PLL device (100) may include an analog phase detector (110) that may be an integrated circuit and include functionality to determine a difference in phase between two input signals. For example, one input signal may be a reference signal (105) while another input signal may be generated directly and/or indirectly by the PLL device (100), such as the feedback signal A (146), feedback signal B (147), or the output signal (180).

Thus, the analog phase detector (110) may include functionality to detect a difference in phase between the two input signals.

While an analog phase detector is shown inside the PLL device (100) in FIG. 1, an analog phase-frequency detector may be used instead. A phase-frequency detector inside the PLL device (100) may produce two signals that correspond to the phase difference and the frequency difference rather than one phase difference signal as produced by the analog phase detector (110).

Keeping with FIG. 1, the PLL device (100) may include a charge pump (120), a loop filter (130), a voltage-controlled oscillator (VCO) (140), and a feedback divider (145). The charge pump (120) may be hardware that includes functionality to generate a current signal from a voltage signal, e.g., a voltage signal that relates to the phase difference detected by the analog phase detector (110). The loop filter (130) may be hardware that includes functionality to produce stability within the PLL device (100) as well as a frequency bandwidth for the type of reference signal (105) synchronize with the output signal (180). For example, the loop filter (130) may be a low pass filter that operates on a voltage signal produced by the charge pump (120). The voltage-controlled oscillator (140) may be hardware that includes functionality to generate an oscillating signal. Thus, the voltage-controlled oscillator (140) may include functionality to obtain a direct current signal from the loop filter (130) to generate the output signal (180) with a predefined period and frequency.

The feedback divider (145) may be hardware, such as an integrated circuit, that includes functionality to divide the frequency of the output signal (180) by an N-multiple. This division by the feedback divider (145) may produce a divided signal (e.g., feedback signal A (146), feedback signal B (147)) for transmission as an input to the analog phase detector (110). Accordingly, the PLL device (100) may multiply the reference signal (105) by an N-multiplier to generate the output signal (180) accounting for frequency division by the feedback divider (145). While two feedback signals (146, 147) are shown in FIG. 1, the feedback signals (146, 147) may be the same or equivalent signals.

While the PLL device (100) is shown with various components (e.g., a charge pump (120), a loop filter (130), a voltage-controlled oscillator (140), and a feedback divider (145)), one or more of these components may be absent from the PLL device (100). Furthermore, one or more components not shown may be included in the PLL device (100).

The reference signal (105) may be a voltage signal that includes functionality for locking the output signal (180). For example, the reference signal (105) may be a reference clock signal generated by a reference clock source (not shown). Accordingly, the output signal (180) may be an extracted clock signal produced by the PLL device (100) using the reference signal (105). The reference clock source may be software and/or hardware, such as an integrated circuit, that includes functionality to generate and/or transmit synchronized timing information to the PLL device (100). The reference clock source may be a single network element on a network or distributed over several network elements as a software-defined solution on the network. Thus, the computing system (195) may be a network element on the network that uses the PLL device (100) to produce a synchronized clock cycle with other network elements in the network. While the PLL device (100) may be directed to extracting a clock signal for the computing system (195), other embodiments are contemplated for the PLL device (100) beyond synchronizing timing information on a network as well.

In one or more embodiments, the PLL device (100) is operably connected to a delay element (150). In one or more embodiments, the delay element (150) is hardware and/or software that includes functionality to filter noise from an input signal (e.g., feedback signal A (146), feedback signal B (147), output signal (180)) using the digital filter (170). In one or more embodiments, for example, the delay element (150) is a digitally programmable device that includes functionality to adjust the rising edge or falling edge of the output signal (180) within a predefined resolution and/or bandwidth range. Thus, the delay element (150) may remove at least a portion of the noise in the input signal resulting from the operation of the PLL device (100). In particular, the noise may include phase locked loop (PLL) error, such as jitter, that is produced by various components of the PLL device (100) (e.g., the charge pump (120), the loop filter (130), the voltage-controlled oscillator (140), the feedback divider (145)). Accordingly, the delay element (15) may remove PLL error from the phase of the output signal (180).

Figure 2:
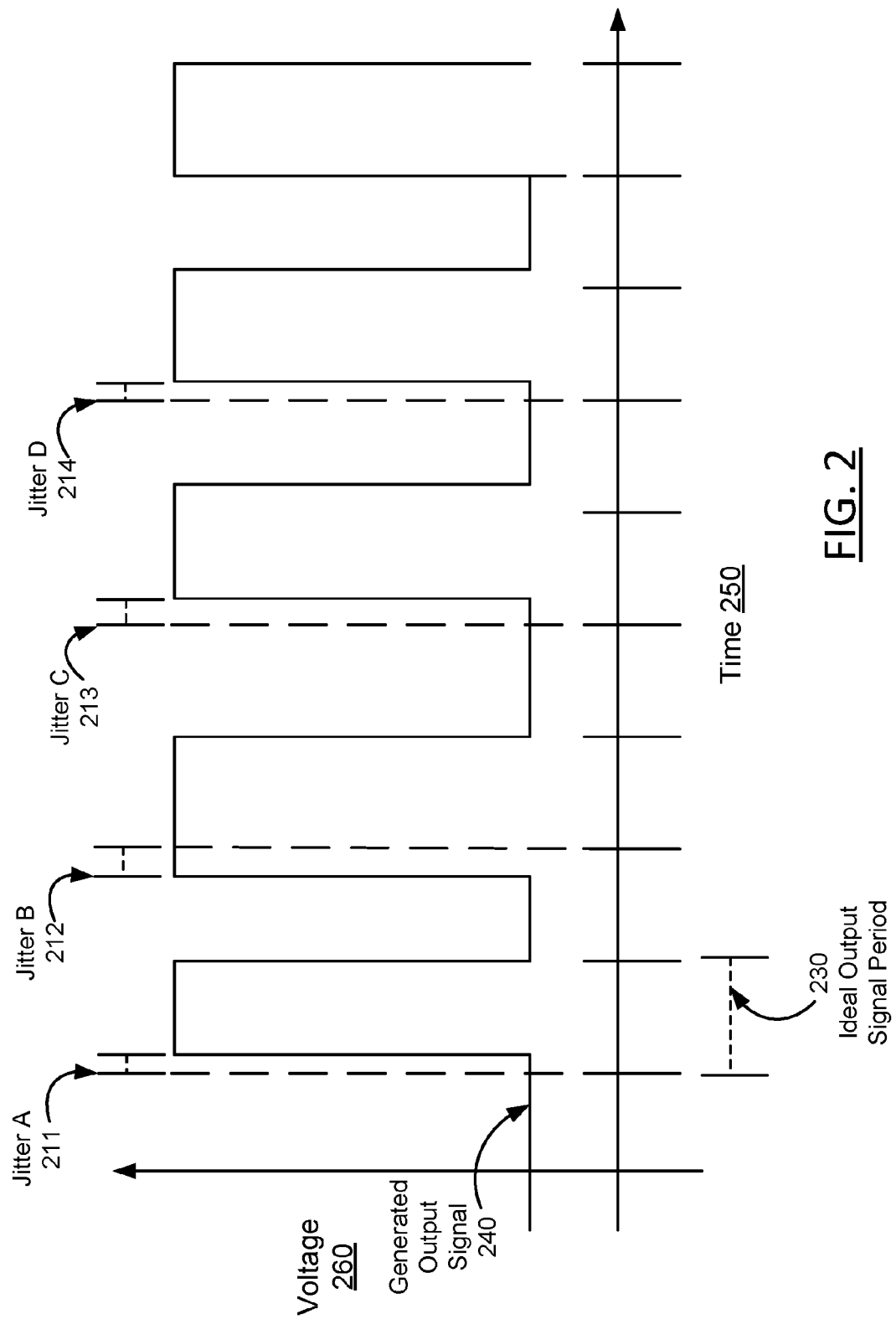
FIG. 2 shows an example of a timing diagram in accordance with one or more embodiments.

Turning to FIG. 2, FIG. 2 shows an example of a timing diagram in accordance with one or more embodiments. As shown in FIG. 2, a generated output signal (240) is compared with an ideal output signal period (230) along an axis (250) with respect to time and another axis (260) with respect to voltage. In particular, the generated output signal (240) includes various amounts of jitter (i.e., jitter A (211), jitter B (212), jitter C (213), jitter D (214)) separating the generated output signal (240) from the ideal output signal period (230). Thus, while the ideal output signal period (230) may be approximately constant, various periods within the generated output signal (240) may deviate from the ideal output signal period (230). This deviation may be the result of PLL error introduced by one or more components in a PLL device, for example. While time-interval error jitter is shown by jitter A (211), jitter B (212), jitter C (213), and/or jitter D (214), other types of jitter may also exist in the generated output signal (230), such as cycle-to-cycle period jitter, long term jitter, phase jitter, and any other forms of phase noise.

Returning to FIG. 1, in one or more embodiments, the PLL device (100) is operably connected to a digital phase detector (160). The digital phase detector (160) may be hardware and/or software that includes functionality to determine a difference in phase between the reference signal (105) and an input signal. For example, the input signal may be the feedback signal A (146), the feedback signal B (147), or the output signal (180).

In one or more embodiments, the digital phase detector (160) is operably connected to a digital filter (170). The digital filter (170) may be hardware and/or software that includes functionality to produce a filter in the feedback loop produced using the PLL device (100). Accordingly, the digital filter (170) may include functionality to use the difference in phase between the reference signal (105) and an input signal obtained by the digital phase detector (160). In one or more embodiments, for example, the digital filter (170) is an integrated circuit that includes functionality to store the difference in phase as various phase locked loop (PLL) error measurements (175), such as in a hardware register. Using the stored PLL error measurements (175), for example, the digital filter (170) may include functionality to generate a control signal (153) for operating the delay element (150) on an input signal (e.g., feedback signal A (146)).

In one or more embodiments, for example, the digital filter (170) is a digital accumulator. Using the PLL error measurements (175), for example, the digital accumulator may include functionality to produce a code signal for operating the delay element (150). The code signal may be the control signal (153) and describe a binary code, for example, that designates whether the delay element (175) moves the rising edge of an input signal (e.g., feedback signal A (146)). If the digital accumulator produces a code signal with a '1', then the delay element (150) may delay the input signal by a specific amount of time. If the code signal is a '0', then the delay element (150) may advance the input signal by a specific of time. However, other embodiments are contemplated with other code sequences such as multi-bit code signals (e.g., "1001") that determines a specific amount of phase delay or an amount of phase advance regarding the input signal to the delay element (150).

In one or more embodiments, the delay element (150) includes a steady-state detector (157). In one or more embodiments, for example, the delay element (150) includes functionality to operate only while the output signal (180) is locked to the reference signal (105). Thus, the steady-state detector (157) may be hardware and/or software that includes functionality to determine whether the output signal (180) is in a steady-state mode. In the steady-state mode, the phase and/or frequency of the output signal (180) may be locked to the reference signal (105). In other words, the amount of phase error and/or frequency error may have converged to a local minimum where the output signal (180) is approximately constant with respect to the reference signal (105). On the other hand, when the PLL device (100) is in a transient mode, the PLL device (100) is adjusting the phase and/or frequency of the output signal (180) to match the reference signal (105).

In one or more embodiments, the steady-state detector (157) causes the delay element (150) to enter a transparent mode. In a transparent mode, the delay element (150) may not provide any signal delay to an input signal (e.g., feedback signal A (146), output signal (180)) before relaying the input signal to the analog phase detector (110). While the steady-state detector (157) is shown inside the delay element (150), the steady-state detector (157) may be located outside the delay element (150).

Figure 3:
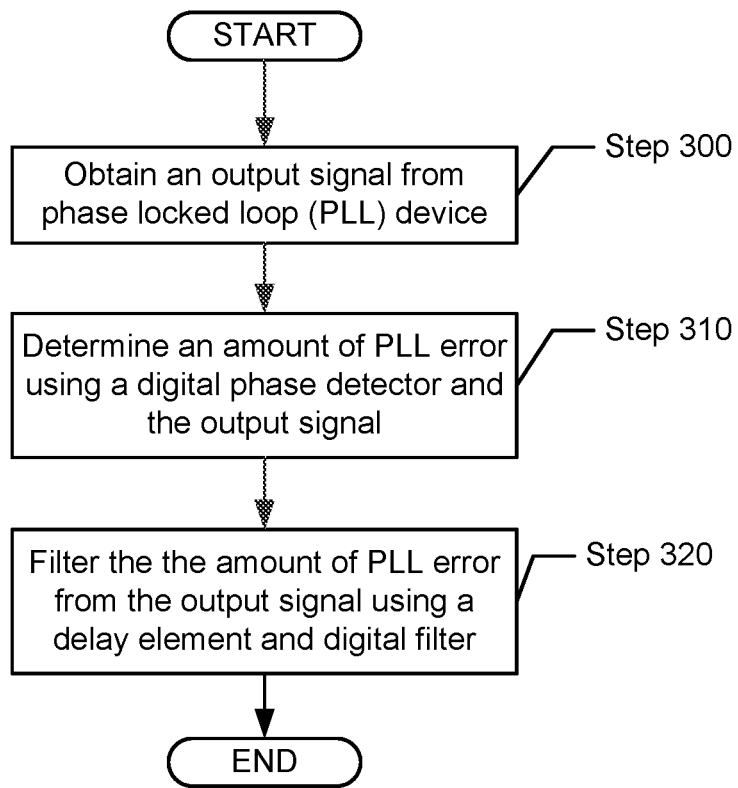
FIGS. 3 and 4 show flowcharts in accordance with one or more embodiments.

FIG. 3 shows a flowchart in accordance with one or more embodiments. Specifically, one or more steps in FIG. 3 may be performed by one or more components as described in FIG. 1. While the various steps in this flowchart are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 300, an output signal is obtained from a phase locked loop (PLL) device in accordance with one or more embodiments. For example, the output signal may be an extracted clock signal with the phase and/or frequency of the extracted clock signal matched to a reference clock signal. On the other hand, the output signal may be a feedback signal produced by a feedback divider in the PLL device.

The PLL device may obtain the reference clock signal from a reference clock source, such as a global positioning system (GPS) signal with frequency and phase information. In one or more embodiments, the output signal in Step 300 is obtained after the PLL device enters a steady-state mode. In a steady-state mode, the PLL device is locked to the reference clock signal. While the output signal may be a direct output from a voltage-controlled oscillator inside the PLL device, the output signal may be a resulting signal from a feedback divider, for example.

In Step 310, an amount of PLL error is determined using a digital phase detector and an output signal in accordance with one or more embodiments. In particular, an amount of PLL error produced within the PLL device may be measured in the output signal from Step 300, accordingly. For example, a digital phase detector may determine a difference in phase between an output signal from Step 300 and a reference signal, e.g., a reference clock signal from a reference clock source.

In one or more embodiments, the digital phase detector has a smaller resolution than a sampling rate resolution of the PLL device. For example, the digital phase detector may be a bang-bang arbiter with a resolution approximately 50 femtoseconds or less, and a bandwidth range of a few picoseconds. On the other hand, the sampling rate of the PLL device may correspond to the frequency of a voltage-controlled oscillator inside the PLL device that is used to generate the output signal from Step 300.

In Step 320, an amount of PLL error is filtered from an output signal using a delay element and a digital filter in accordance with one or more embodiments. In one or more embodiments, based on the amount of PLL error detected in Step 310, a control signal may be generated by the digital filter accordingly for adjusting an amount of phase delay produced by the delay element. In other words, the delay element and the digital filter may implement an analog time-domain filter to the output signal from Step 300. Accordingly, the delay element and the digital filter may remove various low frequency signals from the output signal and producing a filtered signal. Thus, the filtered signal may provide an input to an analog phase detector in a PLL device for producing an output signal with less jitter.

While the delay element in Step 320 may be disposed after a feedback divider similar to the delay element shown in FIG. 1, in one or more embodiments, the delay element is disposed before the feedback divider in the feedback loop of a PLL device. In one or more embodiments, where the voltage-controlled oscillator of a PLL device has approximately the same frequency as the reference signal of the PLL device, the delay element is coupled directly to the voltage-controlled oscillator and the analog phase detector. Thus, the delay element may operate without a feedback divider in the PLL device.

In one or more embodiments, the delay element in Step 320 operates only on the output signal of a PLL device. In other words, the PLL error determined in Step 310 may be present throughout the operation of a PLL device while in a steady-state mode. Accordingly, the PLL error may be removed from an output signal produced by the PLL device before transmission of the output signal to another computing device. For example, if the PLL device is extracting a clock signal from a reference clock signal, the delay element may filter the extracted clock signal before a computing application uses the extracted clock signal.

In one or more embodiments, the delay element and digital filter produce an additional pole in the transfer function of a PLL device. Thus, during operation, the delay element and the digital filter may attenuate noise, such as PLL error, at low frequencies within the filter output signal of Step 320.

Figure 4:
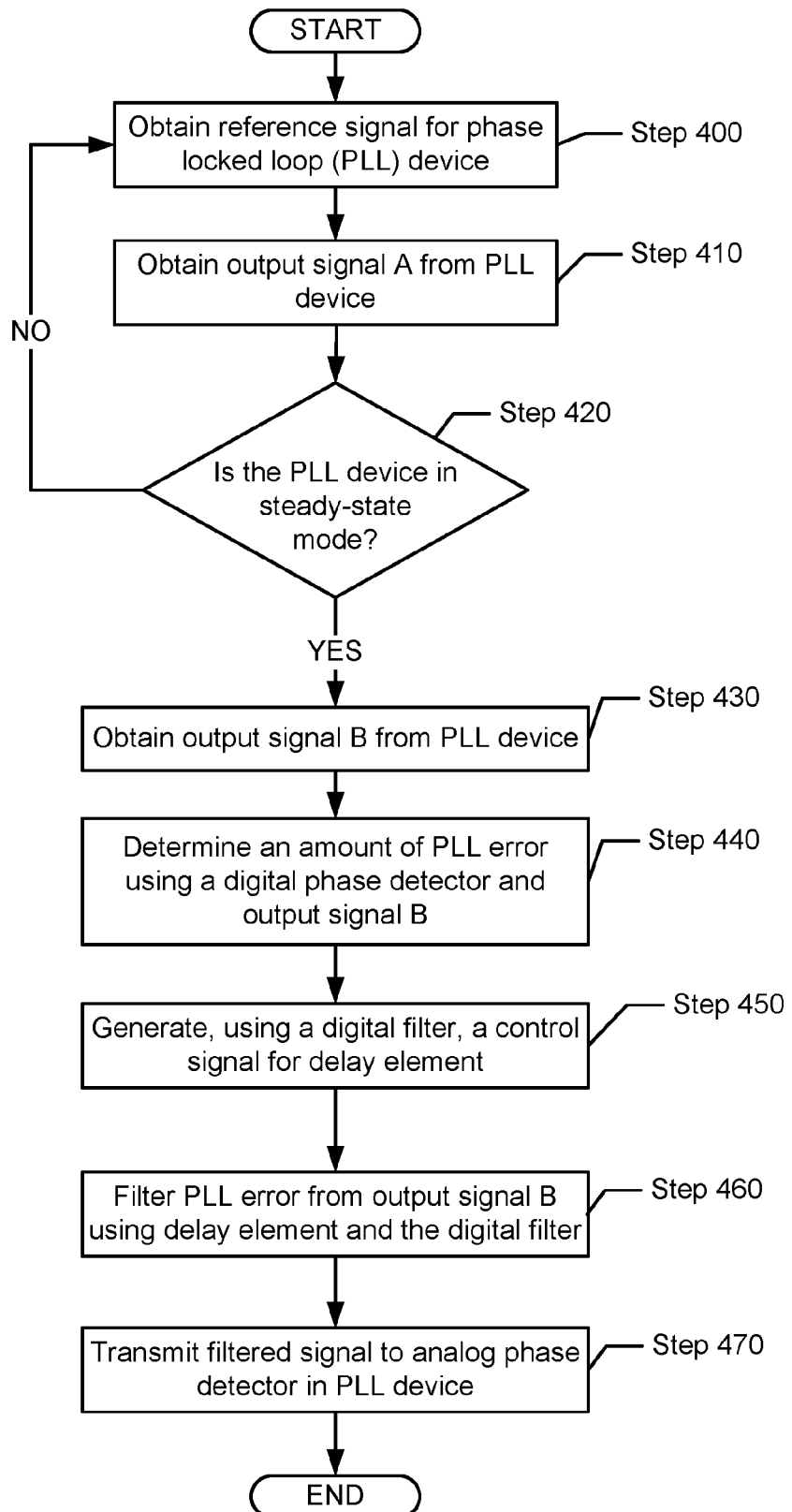

FIG. 4 shows a flowchart in accordance with one or more embodiments. Specifically, one or more steps in FIG. 4 may be performed by one or more components as described in FIG. 1. While the various steps in this flowchart are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 400, a reference signal is obtained for a PLL device in accordance with one or more embodiments. For example, the reference signal may be a reference clock signal obtained from a local oscillator device or a reference clock source.

In Step 410, an output signal A is obtained from a PLL device in accordance with one or more embodiments. For example, the output signal A may be an output signal from a voltage-controlled oscillator or a feedback signal from a feedback divider. As such, the reference signal from Step 400 may be used by a PLL device to lock the output signal A to the phase and/or frequency of the reference signal. Thus, the PLL device may produce a control system, where an analog phase detector may determine a difference in phase, for example, between the reference signal and the output signal A. Based on the difference in phase, the output signal A may be readjusted until the phase of the output signal A matches the phase of the reference signal.

In Step 420, a determination is made whether a PLL device is in a steady-state mode in accordance with one or more embodiments. For example, a steady-state detector may determine whether the difference in phase and/or frequency between the output signal from Step 410 and the reference signal from Step 400 is within a predetermined range corresponding to a steady-state mode. On the other hand, the steady-state detector may determine whether the phase and/or frequency of the output signal from Step 410 have converged to a specified limit, and thus the output signal has locked onto the reference signal. When it is determined that the output signal A has entered a steady-state mode, the process may proceed to Step 430. When it is determined that the output signal A has failed to lock to the reference signal from Step 400, the process may proceed to Step 400.

In Step 430, an output signal B is obtained from a PLL device in accordance with one or more embodiments. After the PLL device enters the steady-state mode in Step 420, for example, an output signal B in the steady-state mode may be obtained from the voltage-controlled oscillator in the PLL device. Thus, the output signal B in Step 430 may be a signal locked on the reference signal from Step 400, but which may be experiencing an amount of jitter and/or other PLL error produced by one or more components in the PLL device. In one or more embodiments, the output signal B is a feedback signal produced by dividing a voltage signal from a voltage controlled oscillator using a feedback divider. Thus, the output signal B may be a voltage signal operating at a frequency that is a multiple of the frequency of a signal produced by the PLL device during the steady-state mode.

In Step 440, an amount of PLL error produced by a PLL device is determined using a digital phase detector and output signal B in accordance with one or more embodiments. In one or more embodiments, a difference in phase between the reference signal in Step 400 and the output signal B in Step 430 is determined using a digital phase detector. Accordingly, the digital phase detector may measure an amount of jitter or other PLL error produced by the PLL device using the difference in phase.

In Step 450, a control signal is generated using a digital filter for a delay element in accordance with one or more embodiments. In one or more embodiments, for example, a digital filter obtains PLL error measurements from the digital phase detector in Step 440. As such, the digital filter may generate a control signal based on the amount of PLL error. For example, the delay element may produce different amounts of signal delay based on different control signals produced by the digital filter. In particular, each control signal may correspond to a different voltage level or signal that designates a different amount of PLL error in a feedback signal from a feedback divider or other input signal.

In Step 460, an amount of PLL error is filtered from output signal B using a delay element and a digital filter in accordance with one or more embodiments. Based on the control signal from Step 450, for example, the delay element may perform various amounts of signal delay on the output signal from Step 430. For example, in one or more embodiments, the delay element has a resolution approximately 50 femtoseconds over a bandwidth range of a few picoseconds. Thus, the delay element may adjust the rising edge and/or the falling edge of the output signal B by a predefined resolution within the specified bandwidth range as determined by the digital filter. PLL error that corresponds to a phase shift within the output signal B may be filtered by the delay element over the specified bandwidth range, accordingly.

In one or more embodiments, the delay element provides PLL error filtering that is independent of the frequency of the reference signal in Step 400. For example, the reference signal may be fixed by an availability of parts or a technology standard. Thus, the delay element may remove PLL error within the output signal B, without any change occurring to the bandwidth of the PLL device. Furthermore, the delay element may not suffer from stability issues at the poles provided by a digital loop (e.g., a digital phase detector and a digital filter). Thus, in one or more embodiments, the delay element has a resolution as large as the peak-to-peak jitter, which may increase jitter suppress capability of the PLL device.

In Step 470, a filtered signal is transmitted to an analog phase detector in a PLL device in accordance with one or more embodiments. For example, the output signal B from Step 430 may be filtered in Step 460 by a delay element to produce a filtered signal. This filtered signal may be relayed to an analog phase detector in a PLL device by the delay element. On the other hand, if there is no jitter or other PLL error in the output signal B, the delay element may operate in a transparent mode, i.e., passing the output signal B to the analog phase detector without shifting the rising edge and/or falling edge of the output signal B.

In one or more embodiments, a digital phase detector is used in place of the analog phase detector in the PLL device in Step 470. In one or more embodiments, with a digital phase detector in the PLL device, a digital filter and delay element in Step 450 have a phase range large enough to cover discrete phase steps produced by a digital phase detector inside the PLL device.

In one or more embodiments, the processes described with respect to FIGS. 3 and 4 and the accompanying description are applied to an injection locking circuit. For example, an injection locking circuit may operate as a high-order injection locked PLL device. As such, a delay element may operate on a reference signal that is an input to a pulse generator in the injection locking circuit. The pulse generator may be coupled to an injection locked voltage-controlled oscillator (ILVCO) in the injection locking circuit, where the output of the ILVCO is coupled to a feedback divider. The output of the feedback divider may be coupled to a digital phase detector. Accordingly, a digital phase detector, a digital filter, and a delay element may be implemented to remove residual jitter and other PLL error from the reference signal providing an input signal to the injection locking circuit.

Figure 5:
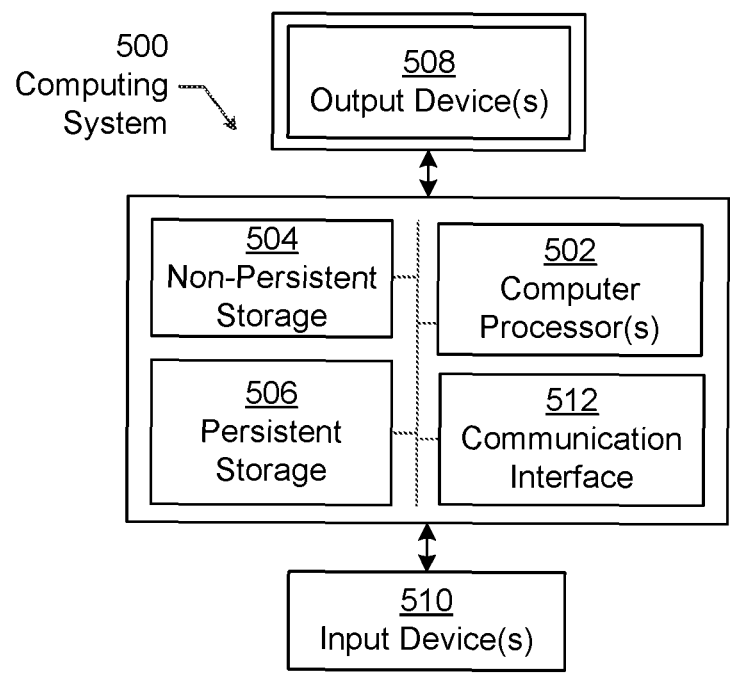
FIG. 5 shows a computing system in accordance with one or more embodiments.

Embodiments may be implemented on a computing system. Any combination of mobile, desktop, server, router, switch, embedded device, or other types of hardware may be used. For example, as shown in FIG. 5, the computing system (500) may include one or more computer processors (502), non-persistent storage (504) (e.g., volatile memory, such as random access memory (RAM), cache memory), persistent storage (506) (e.g., a hard disk, an optical drive such as a compact disk (CD) drive or digital versatile disk (DVD) drive, a flash memory, etc.), a communication interface (512) (e.g., Bluetooth interface, infrared interface, network interface, optical interface, etc.), and numerous other elements and functionalities.

The computer processor(s) (502) may be an integrated circuit for processing instructions. For example, the computer processor(s) may be one or more cores or micro-cores of a processor. The computing system (500) may also include one or more input devices (510), such as a touchscreen, keyboard, mouse, microphone, touchpad, electronic pen, or any other type of input device.

The communication interface (512) may include an integrated circuit for connecting the computing system (500) to a network (not shown) (e.g., a local area network (LAN), a wide area network (WAN) such as the Internet, mobile network, or any other type of network) and/or to another device, such as another computing device.

Further, the computing system (500) may include one or more output devices (508), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (502), non-persistent storage (504), and persistent storage (506). Many different types of computing systems exist, and the aforementioned input and output device(s) may take other forms.

In one or more embodiments, software may be implemented as software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the invention.

The computing system in FIG. 5 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 5 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

The above description of functions present only a few examples of functions performed by the computing system of FIG. 5. Other functions may be performed using one or more embodiments.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system, comprising:
   a phase locked loop (PLL) device that comprises
      an analog phase detector configured to obtain a reference signal,
      a voltage-controlled oscillator (VCO) device, wherein the VCO device is configured to generate, based on the reference signal, an output signal,
      a feedback divider coupled to the VCO device, wherein the feedback divider is configured to produce a feedback signal using the output signal of the VCO device;
   a delay element coupled to the feedback divider and the analog phase detector,
      wherein the delay element is configured to receive the feedback signal from the feedback divider;
   a digital phase detector coupled to the delay element and the VCO device, the digital phase detector configured to determine an amount of PLL error based on the reference signal and the output signal; and a digital filter coupled to the digital phase detector, wherein the delay element and the digital filter are configured, using the amount of PLL error, to filter a portion of the amount of PLL error from the feedback signal to generate a filtered signal, wherein the delay element is further configured to transmit the filtered signal to the analog phase detector, and wherein the analog phase detector is configured to, based on the filtered signal, detect an amount of phase error in the reference signal.

2. The system of claim 1, further comprising:

a steady-state detector inside the delay element, the steady-state detector configured to determine whether the output signal is locked in a steady-state mode to the reference signal, wherein the delay element is further configured to filter the portion of the amount of PLL error from the output signal while the PLL device is in the steady-state mode.

3. The system of claim 1, further comprising:

wherein the amount of PLL error corresponds to residual jitter produced in the output signal by the PLL device.

4. The system of claim 1, wherein the delay element is further configured to operate in a transparent mode while the output signal is not locked to the reference signal, and wherein the delay element is further configured to relay, during the transparent mode, the output signal to the analog phase detector without filtering the portion of the amount of PLL error from the output signal.

5. The system of claim 1, wherein the digital filter is a digital accumulator configured to generate a control signal using the difference in phase, and wherein the control signal is a binary code that determines whether the delay element moves a rising edge of the output signal.

6. The system of claim 1, further comprising:

wherein the feedback signal is a multiple of an output frequency of a voltage signal generated by the VCO device.

7. The system of claim 1, wherein the delay element is further configured to adjust a rising edge of a period in the output signal at a resolution less than a sampling rate resolution of the PLL device.

8. The system of claim 1, wherein the analog phase detector is a phase-frequency detector.

9. The system of claim 1, wherein the reference signal is a reference clock signal provided by a reference clock source, and wherein the output signal is an extracted clock signal obtained by the PLL device from the reference clock signal.

10. The system of claim 1, wherein the PLL device is an injection locking circuit.

11. An apparatus, comprising:

a phased locked loop (PLL) device; and a processing system coupled to the PLL device, wherein the processing system is configured to obtain, at a delay element, a feedback signal from a feedback divider in the PLL device, wherein the feedback divider generates the feedback signal from a first output signal from the PLL device, determine, using a digital phase detector and the feedback signal, an amount of PLL error produced by the PLL device, and filter, using the delay element and a digital filter, a portion of the amount of PLL error from the feedback signal to produce a filtered signal in response to determining the amount of PLL error produced by the PLL device, and transmit the filtered signal from the delay element to an analog phase detector in the PLL device.

12. The apparatus of claim 11, wherein the processing system is further configured to:

determine whether the first output signal is locked to a reference signal in a steady-state mode; and relay, using the delay element and without filtering the feedback signal, the feedback signal to the analog phase detector in response to determining that the first output signal is not locked to the reference signal.

13. The apparatus of claim 11, wherein the feedback signal operates at a feedback frequency that is a multiple of a signal frequency of a voltage signal generated by a voltage-controlled oscillator device in the PLL device.

14. The apparatus of claim 11, wherein the processing system is further configured to:

obtain a reference signal; and determine whether the first output signal is locked to the reference signal in a steady-state mode, wherein the delay element filters the feedback signal in response to determining that the first output signal is locked.

15. The apparatus of claim 11, wherein the processing system is further configured to:

obtain a reference signal;

determine, using the digital phase detector, a difference in phase between the reference signal and the first output signal; and generate, using the difference in phase and by a digital accumulator, a control signal that triggers the delay element to filter the at least a portion of amount of the PLL error from the first output signal.

16. A method for filtering noise, comprising:

obtaining, at a delay element, a feedback signal from a feedback divider in a phase locked loop (PLL) device, wherein the feedback divider generates the feedback signal from a first output signal from the PLL device;

determining, using a digital phase detector and the feedback signal, an amount of PLL error produced by the PLL device;

filtering, using the delay element and a digital filter, a portion of the amount of PLL error from the feedback signal to produce a filtered signal in response to determining the amount of PLL error produced by the PLL device; and transmitting the filtered signal from the delay element to an analog phase detector in the PLL device.

17. The method of claim 16, further comprising:

determining whether the first output signal is locked to a reference signal in a steady-state mode; and relaying, using the delay element and without filtering the feedback signal, the feedback signal to the analog phase detector in response to determining that the first output signal is not locked to the reference signal.

18. The method of claim 16, further comprising:

obtaining a reference signal; and determining whether the first output signal is locked to the reference signal in a steady-state mode, wherein the delay element filters the feedback signal in response to determining that the first output signal is locked.

19. The method of claim 16, further comprising:

obtaining a reference signal;

determining, using the digital phase detector, a difference in phase between the reference signal and the first output signal; and generating, using the difference in phase and by a digital accumulator, a control signal that triggers the delay element to filter the at least a portion of amount of the PLL error from the feedback signal.

20. The method of claim 16, wherein the reference signal is a reference clock signal provided by a reference clock source, and wherein the first output signal is an extracted clock signal obtained by the PLL device from the reference clock signal.

\* \* \* \* \*